(12) United States Patent
Heiss et al.

(10) Patent No.: US 11,688,984 B2
(45) Date of Patent: Jun. 27, 2023

(54) HIGH-CURRENT CONTACT DEVICE AND METHOD OF PRODUCING A HIGH-CURRENT CONTACT DEVICE

(71) Applicant: TE Connectivity Germany GmbH, Bensheim (DE)

(72) Inventors: Dominik Heiss, Bensheim (DE); Philipp Kowarsch, Bensheim (DE); Tobias Meissner, Bensheim (DE); Frank Wittrock, Bensheim (DE)

(73) Assignee: TE Connectivity Germany GmbH, Bensheim (DE)

( * ) Notice: Subject to any disclaimer, the term of this patent is extended or adjusted under 35 U.S.C. 154(b) by 182 days.

(21) Appl. No.: 17/351,652

(22) Filed: Jun. 18, 2021

(65) Prior Publication Data

US 2021/0399510 A1 Dec. 23, 2021

(30) Foreign Application Priority Data

Jun. 23, 2020 (DE) .................... 10 2020 116 535.8

(51) Int. Cl.
*H01R 4/36* (2006.01)
*H01R 27/02* (2006.01)
(Continued)

(52) U.S. Cl.
CPC ............ *H01R 27/02* (2013.01); *H01R 13/50* (2013.01); *H01R 13/521* (2013.01); *H01R 13/6683* (2013.01); *H01R 43/205* (2013.01); *H01R 43/24* (2013.01); *H05K 1/18* (2013.01); *H01R 12/57* (2013.01); *H01R 12/58* (2013.01);
(Continued)

(58) Field of Classification Search
CPC ...... H01R 4/36; H01R 4/363; H01R 13/5208; H01R 13/5205; H01R 4/72
See application file for complete search history.

(56) References Cited

U.S. PATENT DOCUMENTS 4,092,946 A * 6/1978 Kappas .................. H02K 7/116
475/149
5,626,486 A * 5/1997 Shelly .................... H01R 13/53
439/273

(Continued)

FOREIGN PATENT DOCUMENTS

CN 110676648 A 1/2020
DE 20 2007 018 306 U1 6/2008
(Continued)

OTHER PUBLICATIONS

German Office Action, dated Feb. 23, 2021, 9 pages.
(Continued)

*Primary Examiner* — Phuong Chi Thi Nguyen
(74) *Attorney, Agent, or Firm* — Barley Snyder

(57) ABSTRACT

A high-current contact device includes a first contact element transmitting electrical energy, a circuit carrier, a first data contact transmitting data, and a data interface. The first contact element extends through the circuit carrier along a mating axis at a feedthrough. A conductor track of the circuit carrier electrically connects the first data contact to the data interface. A carrier of the circuit carrier is injection-molded and mechanically supports the first data contact, the conductor track, and the data interface.

20 Claims, 8 Drawing Sheets

(51) Int. Cl.
    *H01R 13/50*     (2006.01)
    *H01R 13/52*     (2006.01)
    *H01R 13/66*     (2006.01)
    *H01R 43/20*     (2006.01)
    *H01R 43/24*     (2006.01)
    *H05K 1/18*     (2006.01)
    *H01R 12/57*     (2011.01)
    *H01R 12/58*     (2011.01)

(52) U.S. Cl.
    CPC .............. *H05K 2201/09227* (2013.01); *H05K 2201/09281* (2013.01); *H05K 2201/10189* (2013.01); *H05K 2201/10303* (2013.01); *H05K 2201/2009* (2013.01)

(56) References Cited

U.S. PATENT DOCUMENTS

| | | | |
|---|---|---|---|
| 6,053,766 A * | 4/2000 | Muramatsu | H01R 33/09 439/558 |
| 6,203,355 B1 * | 3/2001 | Neblett | B60L 50/66 439/372 |
| 2017/0358890 A1 | 12/2017 | Chen et al. | |
| 2023/0009516 A1 * | 1/2023 | Chatelus | B60L 53/18 |

FOREIGN PATENT DOCUMENTS

| | | |
|---|---|---|
| DE | 20 2007 018 307 U1 | 7/2008 |
| DE | 10 2014 102 991 B3 | 9/2015 |
| DE | 10 2016 107 401 A1 | 8/2017 |
| DE | 10 2018 133 100 A1 | 6/2020 |
| EP | 3644456 A1 | 4/2020 |
| JP | 2009043509 A | 2/2009 |
| WO | 2015131883 A1 | 9/2015 |
| WO | 2019239247 A1 | 5/2019 |

OTHER PUBLICATIONS

English translation of CN 110676648A, dated Jan. 10, 2020, 26 pages.
English translation of JP 2009043509A, dated Feb. 26, 2009, 2 pages.

\* cited by examiner

US 11,688,984 B2

HIGH-CURRENT CONTACT DEVICE AND METHOD OF PRODUCING A HIGH-CURRENT CONTACT DEVICE

CROSS-REFERENCE TO RELATED APPLICATIONS

This application claims the benefit of the filing date under 35 U.S.C. § 119(a)-(d) of German Patent Application No. 102020116535.8, filed on Jun. 23, 2020.

FIELD OF THE INVENTION

The present invention relates to a contact device and, more particularly, to a high-current contact device.

BACKGROUND

German Patent Application no. DE 10 2016 107 401 A1 discloses a plug-in device insert, which contains contact elements such as, for example, contact pins for conducting an electric current. The contact elements contain a contact region, in which they make contact with complementary contact elements, and a connection region, in which a conductor is connected. The temperature of at least one contact element is detected in a measurement region located between the contact region and the connection region.

SUMMARY

A high-current contact device includes a first contact element transmitting electrical energy, a circuit carrier, a first data contact transmitting data, and a data interface. The first contact element extends through the circuit carrier along a mating axis at a feedthrough. A conductor track of the circuit carrier electrically connects the first data contact to the data interface. A carrier of the circuit carrier is injection-molded and mechanically supports the first data contact, the conductor track, and the data interface.

BRIEF DESCRIPTION OF THE DRAWINGS

The invention will now be described by way of example with reference to the accompanying Figures, of which.

DETAILED DESCRIPTION OF THE EMBODIMENTS

Reference is made to a coordinate system in the following figures. By way of example, the coordinate system is designed as a right-hand system and has an x axis (longitudinal direction), a y axis (transverse direction) and a z axis (vertical direction).

Figure 1:
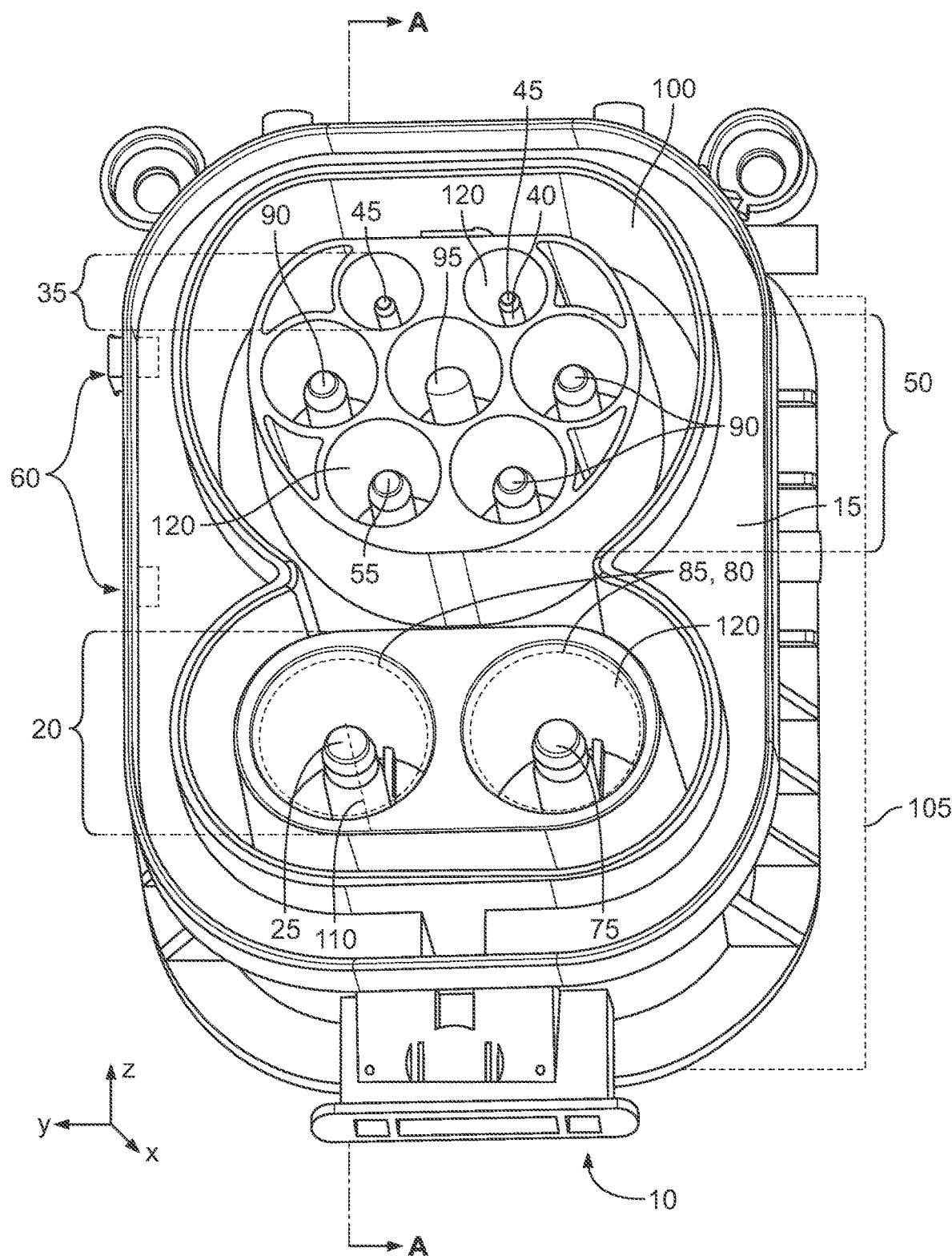
FIG. 1 is a perspective view of a high-current contact device.

FIG. 1 shows a first perspective illustration of a high-current contact device 10. The high-current contact device 10 has a contact housing 15, a first contact arrangement 20 with at least one first contact element 25, a circuit carrier 30 (obscured by other elements in FIG. 1) and a data contact arrangement 35 with at least one first data contact 40. The data contact arrangement 35 can also additionally have a second data contact 45. The high-current contact device 10 can also have a second contact arrangement 50 with at least one second contact element 55 designed for the transmission of electrical energy. In the embodiment, the first contact arrangement 20 is arranged offset in the z direction to the second contact arrangement 50. The data contact arrangement 35 is arranged next to the second contact arrangement 50 in the z direction opposite the first contact arrangement 20.

In addition, the high-current contact device 10 has at least one data interface 60 laterally arranged. The data interface 60 can have a first data contact device 65 and a second data contact device 70, which are indicated in FIG. 1 by dashes and shown in greater detail in FIG. 2. The data interface 60 extends through the contact housing laterally in a plane inclined to the mating axis 110. As a result, the data interface 60 can be contacted particularly easily from outside. Furthermore, because the data interface 60 is guided laterally out of the contact housing 15, the data interface 60 can be sealed easily and a housing interior 100 can be protected against the ingress of corrosive media via the data interface 60.

As shown in FIG. 1, the first contact arrangement 20 can have a third contact element 75. The third contact element 75 can be of identical design to the first contact element 25. In this case, by way of example, the third contact element 75 is arranged offset to the first contact element 25 in the y direction, wherein, by way of example, the first contact element 25 and the third contact element 75 are arranged in a common xy plane. In this case, in FIG. 1, the first and third contact element 25, 75 are in contact with a mating contact 80 of a further high-current contact device 85, said mating contact 80 being designed in each case in a manner corresponding to the first and third contact element 25, 75. The further high-current contact device 85 is indicated in FIG. 1 only schematically by dashed lines.

The second contact arrangement 50 can have at least one fourth contact element 90 in addition to the second contact element 55, as shown in FIG. 1. In the embodiment, the second contact arrangement 50 additionally has a fifth contact element 95, wherein the second contact element 55 and the fourth contact element 90 are designed identically to one another and differently to the first and third contact element 25, 75 and the fifth contact element 95 is designed differently to the first to fourth contact element 25, 75, 55, 90.

In the embodiment, the second contact arrangement 50 is designed by way of example as a five-pole contact arrangement. In this case, the third and fourth contact element 75, 90 are arranged on a circular track around the fifth contact element 95. The first and second data contact 40, 45 are arranged in a common xy plane and likewise arranged on the circular track around the fifth contact element 95.

For each of the contact elements 25, 55, 75, 90, 95 and for the data contacts 40, 45, the contact housing 15 has an associated contact receptacle 120, which extends in each case through the contact housing 15 along the mating axis 110. The contact receptacle 120 is partially closed by the circuit carrier 30 on the rear side of the high-current contact device 10 shown in FIG. 1.

In this case, the contact housing 15 is designed to mechanically support the contact element 25, 55, 75, 90, 95 and the data contact 40, 45, respectively, and to electrically insulate them from one another. In this case, the contact element 25, 55, 75, 90, 95 and the respectively associated data contact 40, 45 can be pressed into the respectively associated contact receptacle 120 in certain regions.

The high-current contact device 10 and the further high-current contact device 85 can be designed to be sealed so that ingress of moisture, liquid and/or other corrosive media into a housing interior 100 (cf. FIG. 2) of the contact housing 15 is prevented.

The first and second contact arrangement 20, 50 can be connected to a high-current cable 105, for example on a side facing away from the viewer. The high-current cable 105 can be connected, for example, to an electrical energy store, a drive motor of a motor vehicle or a control device of the vehicle. The high-current cable 105 can also be connected to a charging station in order to provide a charging current for charging the electrical energy store. In the embodiment, the high-current contact device 10 shown in FIG. 1 serves to connect a charging plug of a charging station to an internal charger of the motor vehicle for charging the electrical energy store. To this end, the first contact arrangement 20 is designed to transmit electrical energy, which is present at the first and third contact element 25, 75 by way of a DC voltage, to the charger.

By way of example, the first and third contact element 25, 75 is designed to transmit an electric current of at least 30 to 1000 amperes, in particular of 50 to 500 amperes, over a period of at least 30 seconds. A voltage present between the first contact element 25 and the third contact element 75 can be between 48 volts and 500 volts. The voltage present between the first and third contact element 25, 75 therefore differs significantly from the conventional 12 or 24 volt network of the motor vehicle.

The second contact arrangement 50 is likewise designed for transmission of electrical energy. In this case, the electrical energy to be transmitted via the second contact arrangement 50 can be present at the second contact arrangement 50 as alternating current, in particular as three-phase alternating current. Depending on the alternating current present, the second contact arrangement 50 has a corresponding number of second, fourth and fifth contact elements 55, 90, 95. If, as shown in FIG. 1, the electrical energy is provided as three-phase alternating current, the second contact arrangement 50 accordingly has five contact elements 55, 90, 95. In this case, the fifth contact element 95 can be connected to an earth connection/protective earthing conductor and the second and fourth contact element 55, 90 can be connected to an outer conductor. The AC voltage can be provided, for example, by a domestic connection.

An electric current transmitted via the second, fourth and fifth contact element 55, 90, 95 is considerably lower than the electric current transmitted via the first and third contact element 25, 75, for example in a range of 1 to 32 amperes, in particular in a range of 1 to 16 amperes. An AC voltage present between the second, fourth or the fifth contact element 55, 90, 95 can be up to approximately 600 volts. As a result, for example, the second contact element 55 can be designed to be significantly smaller and, for example, by way of the contact portion, significantly shorter than the first contact element 25.

The data contact arrangement 35 shown in FIG. 1 serves for data transmission and therefore not for transmission of electrical energy for charging the energy store or driving the drive motor, but instead for transmitting information, for example about an operating state of the energy store or charging information of the charger, to the charging station. As a result, the electrical energy transmitted by the data contact device is particularly low, wherein an electric current of 0.1 amperes, which is transmitted via the data contact arrangement 35, is not exceeded.

In the embodiment shown in FIG. 1, the first contact element 25 extends along a mating axis 110 in a straight line. The mating axis 110 is oriented running parallel to the x axis. The second to fifth contact element 55, 75, 90, 95 and the data contact element 40, 45 are likewise designed running parallel to the mating axis 110.

The first to fifth contact element 25, 55, 75, 90, 95 is designed by way of example as a pin contact and serves for electrical contact connection of the mating contact 80 designed as a socket contact, which is designed by way of example as a pin contact.

Figure 2:
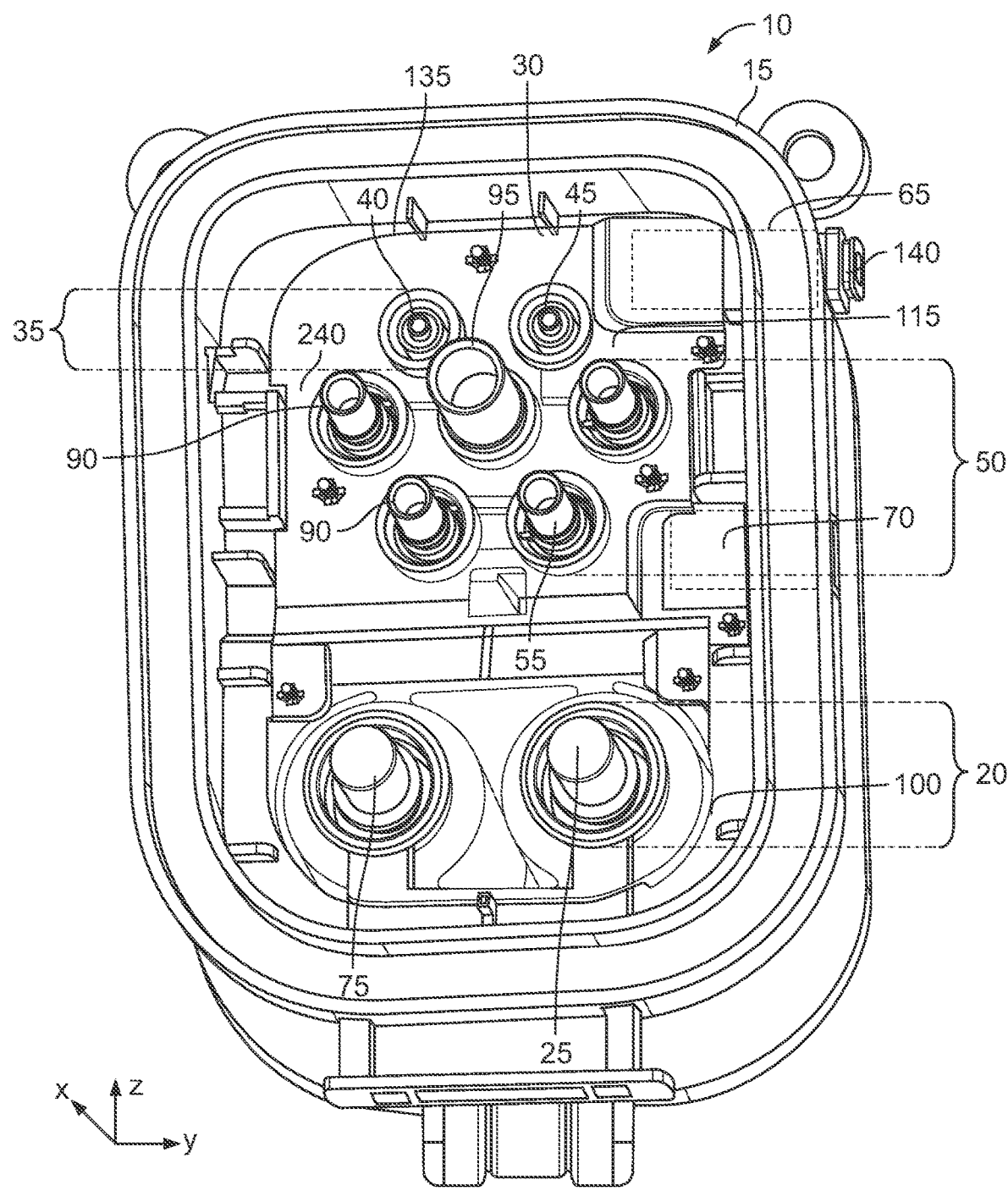
FIG. 2 is another perspective view of the high-current contact device of FIG. 1.

FIG. 2 shows a second perspective illustration of the high-current contact device shown in FIG. 1. The circuit carrier 30 is arranged in the housing interior 100 of the contact housing 15. The circuit carrier 30 is designed in the embodiment as an injection-molded circuit carrier, which is generally referred to as a molded integrated device (MID). The circuit carrier 30 has a carrier 115. The carrier 115 comprises an electrically insulating material. The electrically insulating material can be, in particular, polypropylene, polyethylene and/or a temperature-resistant plastic. In an embodiment, the carrier 115 is monolithically formed in a single piece from a same material.

On a first end side 135 facing away from the viewer in FIG. 2, the first data contact device 65 and the second data contact device 70 are mechanically connected to the carrier 115. The data contact device 65, 70 is guided laterally through the contact housing 15 in a plane perpendicular to the mating axis 110 and is able to be contacted on the outer side by a data connection device 140 designed in a manner corresponding to the first and/or second data contact device 65, 70. The first and second data contact device 65, 70 are designed by way of example in a sealed manner, with the result that ingress of fluids or liquid between the contact housing 15 and the data contact device 65, 70 into the housing interior 100 is prevented.

On the side of the first to fifth contact element 25, 55, 75, 90, 95 facing towards the viewer in FIG. 2, the respective contact element 25, 55, 75, 90, 95 can be electrically connected, for example crimped, to an electrical conductor of the high-current cable 105. The data contact 40, 45 can be connected, for example crimped, on the side shown in FIG. 2 to a data cable, for example a twisted-pair cable.

Figure 3:
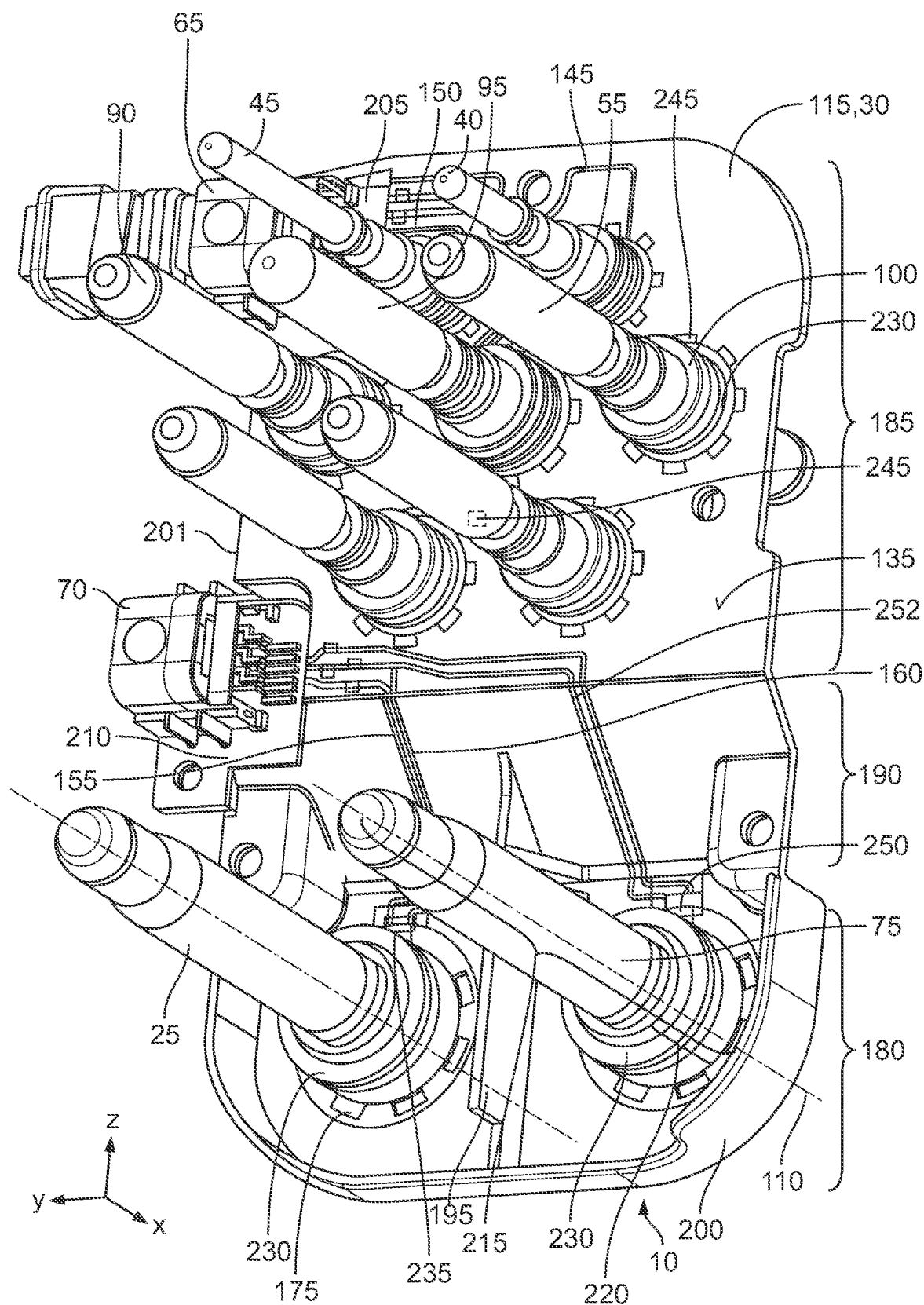
FIG. 3 is another perspective view of the high-current contact device of FIG. 1.

FIG. 3 shows a perspective illustration of the high-current contact device 10, wherein the illustration of the contact housing 15 is omitted in FIG. 3 for reasons of clarity. The circuit carrier 30 has one or more exemplary conductor tracks 145, 150, 155, 160, 252, which are arranged by way of example on the first end side 135 of the carrier 115. In this case, by way of example, a first conductor track 145 connects the first data contact 40 to the first data contact device 65. Furthermore, a second conductor track 150 electrically connects the first data contact device 65 to the second data contact 45.

At least one electrical circuit 165 can be arranged on the circuit carrier 30. The electrical circuit 165 is electrically connected to the second data contact device 70, for example by a third conductor track 155 and a fourth conductor track 160. The electrical circuit 165 is designed to identify a piece of information about an operating parameter of the high-current contact device 10. With the third and fourth conductor track 155, 160, the electrical circuit 165 is designed to provide a piece of information about the operating parameter of the high-current contact device 10 at the second data contact device 70.

On a second end side 240 facing away from the viewer in FIG. 3, the carrier 115 is by way of example free of conductor tracks 145, 150, 155, 160. The conductor track 145, 150, 155, 160 is produced, for example, from copper and/or aluminum and/or aluminum oxide and/or aluminum nitrate and/or silicon oxide and/or silicon nitrate and/or boron nitride and/or electrically conductive and/or non-conductive chemical modification of ferrous and/or non-ferrous metals. The circuit carrier 30 can also be designed with multiple layers so that the conductor tracks 145, 150, 155, 160 are designed running in part in the interior of the carrier 115.

The operating parameter can be, for example, a temperature of the high-current contact device 10 and/or an electric current transmitted via the high-current contact device 10 and/or an electrical power of the first contact arrangement 20 and/or the second contact arrangement 50. It is also possible, for example, for a functionality, for example a polarity of the contact elements 25, 55, 75, 90, 95, to be checked and for the corresponding information to be provided at the second data contact device 70 with the electrical circuit 165.

In the carrier 115, a respective feedthrough 175 is arranged for each contact element 25, 55, 75, 90, 95 and for the data contact 40, 45. The feedthrough 175 is designed in the manner of a bore. The associated contact element 25, 55, 75, 90, 95 or the respectively associated data contact 40, 45 extends through the feedthrough 175 along the mating axis 110. In this case, the feedthrough 175 opens at the contact receptacle 120 at the second end side 240. The contact element 25, 55, 75, 90, 95 and the data contact 40, 45 project beyond the carrier 115 on both sides.

The carrier 115 of the circuit carrier 30 is made in one piece and from the same material. In an embodiment, the carrier 115 has a first portion 180, a second portion 185, and a connecting portion 190. The first portion 180 and the second portion 185 extend in different yz planes arranged offset in the x direction. For example, the first portion 180 in FIG. 3 is arranged offset to the second portion 185 in the x direction away from the viewer. The first portion 180 and the second portion 185 are of substantially flat design. The carrier 115 can be adapted to a geometric design of the high-current contact device 10 in a flexible manner by the carrier 115 made in one piece and from the same material and the portions arranged offset along the mating axis 110. The number of components and the assembly outlay is kept low by the carrier 115 made in one piece and from the same material.

The connecting portion 190 is arranged between the first portion 180 and the second portion 185 and connects the first portion 180 to the second portion 185, as shown in FIG. 3.

The connecting portion 190 is designed to be inclined obliquely to the first portion 180 and the second portion 185.

In addition, the carrier 115 can have at least one reinforcing rib 195, as shown in FIG. 3. The reinforcing rib 195 is arranged on the first portion 180 by way of example between the first contact element 25 and the third contact element 75. In this case, for example, the reinforcing rib 195 runs in an xz plane and extends along the mating axis 110. A collar 200 can also be arranged in a circumferential manner on the first portion 180, wherein the collar 200 projects beyond the first portion 180 in the x direction and is arranged on a side facing towards the second portion 185.

The reinforcing rib 195 ends on one side at the collar 200 and on the other side at the connecting portion 190. The collar 200 and the reinforcing rib 195 reinforce the carrier 115 in the first portion 180 and at the connecting portion 190. As a result, mating forces when the high-current contact device 10 is plugged into the further high-current contact device 85 can be supported particularly well and deformation of the carrier 115 can be prevented. Bending when the first and/or second contact element 25, 55 and/or the data contact 40 are plugged into the carrier 115 can be kept low owing to the reinforcing rib 195, with the result that mechanical damage to the conductor track 145, 150 arranged on the carrier 115 is prevented.

As shown in FIG. 3, the carrier 115 can have a first indentation 205 on the second portion 185. The first indentation 205 is designed as a depression in the second portion 185 and is connected to a side surface 201 of the carrier 115. The side surface 201 runs by way of example substantially in the xz direction. The first indentation 205 receives the first data contact device 65 and is shaped accordingly. The first indentation 205 extends by way of example in the x direction onto a side facing towards the contact receptacle 120.

The first and second conductor track 145, 150 are also led from the data contact 40, 45 via the second portion 185 into the first indentation 205, wherein the first and second conductor track 145, 150 are electrically contact-connected in the first indentation 205 and through the first data contact device 65.

On the side surface 201 of the carrier 115, the carrier 115 has a second indentation 210, as shown in FIG. 3. The second indentation 210 is arranged in the vertical direction at a kink between the second portion 185 and the connecting portion 190 and extends in an x direction facing towards the contact receptacle 120. The second indentation 210 receives the second data contact device 70 and is designed in a manner corresponding to the second data contact device 70.

The data contact device 65, 70 can be positioned in optimum fashion and is particularly easily accessible from the side at the contact housing 15 owing to the first and second indentation 205, 210.

The high-current contact device 10 has a respective sealing sleeve 230, shown in FIG. 3, for each contact element 25, 55, 75, 90, 95 and for each of the data contacts 40, 45. The sealing sleeve 230 comprises a flexible matrix material. The matrix material can comprise, for example, silicone and/or polyurethane and/or plastic. The sealing sleeve 230 is connected at the first end side 135 to the carrier 115 in a materially bonded manner. The carrier 115 and the sealing sleeve 230 are, in an embodiment, produced in a two-component injection-molding method.

The electrical circuit 165 can have a temperature measuring device 170. The temperature measuring device 170 can have at least one first temperature sensor 235, shown in FIG. 3. The first temperature sensor 235 is arranged at a distance from the first contact element 25 physically in the region adjoining the feedthrough 175 through which the first contact element 25 extends. The first temperature sensor 23,5 in an embodiment, is designed to measure a temperature of the first contact element 25 as an operating parameter.

The first temperature sensor 235 can be embedded in the sealing sleeve 230, for example. A particularly good thermal connection of the temperature sensor 235 is provided by virtue of the fact that the temperature sensor 235 is embedded in the sealing sleeve 230. The sealing sleeve 230 is of thermally conductive design and thermally connects the temperature sensor 235 to the first contact element 25. The sealing sleeve 230 comprises in the matrix material a particulate filler material, which comprises, for example, copper and/or aluminum and/or silver. The sealing sleeve 230 has a thermal conductivity of approximately 0.3 W/(m·K) to 2 W/(m·K), in particular 0.3 W/(m·K) to 1.7 W/(m·K). The sealing sleeve 230 thermally connects the first temperature sensor 235 to the first contact element 25. The first temperature sensor 235 is electrically connected to the second data contact device 70 by the third conductor track 155 and the fourth conductor track 160. In an embodiment, the sealing sleeve 230 is overmolded on the temperature sensor 235.

Owing to the design of the circuit carrier 30 as an injection-molded circuit carrier, the third and fourth conductor track 155, 160 is led via the first portion 180 and the connecting portion 190 into the second indentation 210 on the first end side 135, as shown in FIG. 3. The second data contact device 70 makes contact with the third and fourth conductor track 155, 160. The second data contact device 70 is also mechanically connected to the carrier 115 in the second indentation 210.

The conductor tracks 145, 150, 155, 160 run along a contour of the carrier 115. The injection-molded design of the circuit carrier 30 in this case makes it possible for the conductor tracks 145, 150, 155, 160 to be designed not only in one plane, as in the case of a conventional printed circuit board, but following the contour of the carrier 115. As a result, the circuit carrier 30 is of a particularly flat and compact design.

In addition, the temperature measuring device 170 can have a second temperature sensor 245 and/or a third temperature sensor 250, as shown in FIG. 3. The explanations provided in the context of the first temperature sensor 235 apply analogously to the second and third temperature sensor 245, 250. The second temperature sensor 245 can be arranged, for example, in the region of the second contact arrangement 50 on the second portion 185 of the carrier 115 and can be thermally connected to the second, fourth and fifth contact element 55, 90, 95.

The third temperature sensor 250 shown in FIG. 3 can be arranged, for example, in the region 275 at the feedthrough 175 through which the third contact element 75 extends and can be thermally coupled to the third contact element 75. The sealing sleeve 230 on the third contact element 75 can also be arranged on, and in an embodiment injection-molded to, the carrier 115 in such a way that the sealing sleeve 230 completely surrounds the third temperature sensor 250 on the circumferential side. As a result, the third temperature sensor 250 is embedded in the sealing sleeve 230 just as the first temperature sensor 235 is embedded in the associated sealing sleeve 230. As a result, the third temperature sensor 250 is thermally coupled to the third contact element 75 particularly well. In an embodiment, the sealing sleeve 230 has at least one of the following materials: copper, aluminum, aluminum oxide, aluminum nitrate, silicon oxide, silicon nitrate, boron nitride, plastic, temperature-resistant plastic, silicone, polyurethane.

The second temperature sensor 245 is also electrically connected to the first data contact device 65 via conductor tracks. In an analogous manner, the third temperature sensor 250 can be electrically connected to the second data contact device 70 via further conductor tracks 252.

If an electric current, for example in the range of at least 10 or at least 50 amperes, is transmitted via the first contact arrangement 20, the first contact arrangement 20 heats up. The thermal coupling of the first and third contact element 25, 75 via the respectively associated sealing sleeve 230 makes it possible for the first and third temperature sensor 235, 250 to measure the respective temperature of the associated first and third contact element 25, 75 and to provide a corresponding piece of temperature information at the second data contact device 70.

The temperature information about the temperature of the first and third contact element 25, 75 that is provided at the second data contact device 70 can be used when controlling, for example, the charging process, in particular a rapid charging process. Owing to the temperature of the first and third contact element 25, 75 being monitored, it is possible to prevent overheating of the first and third contact element 25, 75, but also of the first portion 180 of the carrier 115 arranged adjoining the first and third contact element 25, 75.

The temperature of the second contact arrangement 50 is also measured and a corresponding piece of temperature information is provided at the first data contact device 65. In particular, this temperature information can be used to prevent overheating of the second contact arrangement 50 during transmission of electrical energy.

The high-current contact device 10 can also be monitored by an evaluation device that can be connected at the data interface 60 through the provision of the operating parameter and therefore, for example, ingress of moisture into the housing interior 100 and/or a temperature in the housing interior 100 and/or a current transmitted via the first contact element 25 can be monitored.

Figure 4:
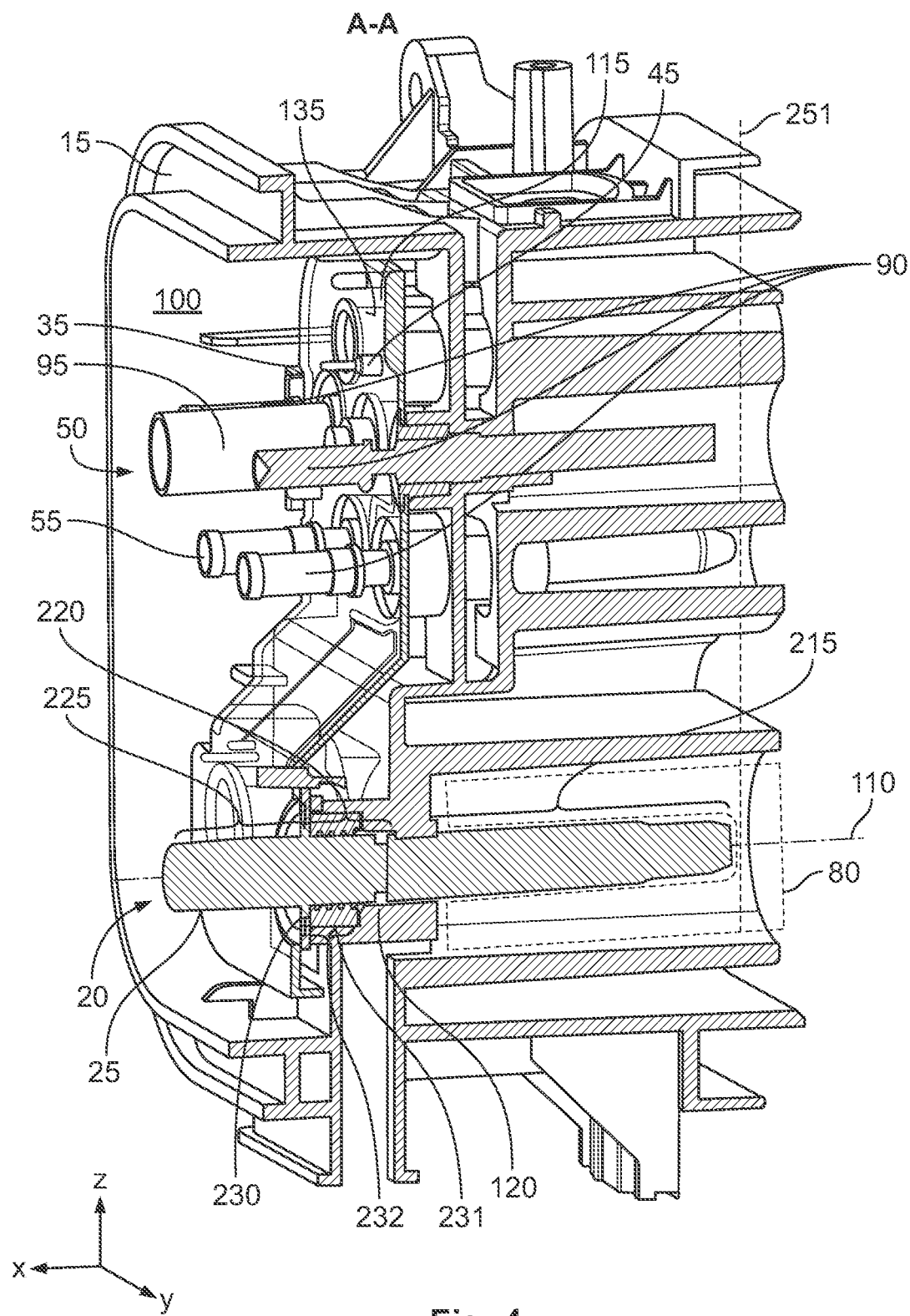
FIG. 4 is a sectional perspective view of the high-current contact device of FIG. 1, taken along plane A-A.

FIG. 4 shows a sectional view along a section plane A-A, shown in FIG. 1, through the high-current contact device 10 shown in FIG. 1. Each of the contact elements 25, 55, 75, 90, 95 and each of the data contacts 40, 45 has a respective contact portion 215, sealing portion 220 and connection portion 225. The sealing portion 220 is arranged between the contact portion 215 and the connection portion 225 in the axial direction in relation to the mating axis 110. By way of the contact portion 215, the contact element 25, 55, 75, 90, 95 respectively provides electrical contact to the associated mating contact 80 or the data contact 40, 45 to a mating data contact. The sealing portion 220 directly adjoins the contact portion 215 in the axial direction in relation to the mating axis 110. The sealing portion 220 can be designed, for example, in the shape of a cylinder. On the rear of a side that is remote in FIG. 4, the connection portion 225 adjoins the sealing portion 220, wherein the contact element 25, 55, 75, 90, 95 is connected via the connection portion 225 to a respectively associated electrical conductor of the high-current cable 105 or the data contact 40, 45. The data contact 40, 45 is connected at the connection portion 225 to the data cable instead of to the high-current cable 105.

The sealing sleeve 230 encloses the respectively associated contact element 25, 55, 75, 90, 95 or the respectively associated data contact 40, 45 on the sealing portion 220 in a fluid-tight manner. The sealing sleeve 230 bears against an inner circumferential side of a sealing region 232 of the contact receptacle 120 by way of an outer circumferential side 231. The sealing sleeve 230 thus prevents ingress of moisture and/or fluids into the housing interior 100 and thus corrosion of the high-current contact device 10.

The first contact arrangement 20 is arranged in the first portion 180. The second contact arrangement 50 and the data contact arrangement 35 are arranged in the second portion 185. Owing to the obliquely running connecting portion 190, by way of example, a physical offset of the first contact arrangement 20 with respect to the second contact arrangement 50 and the data contact arrangement 35 can be created in the longitudinal direction with the result that in each case one free end of the contact elements 25, 55, 75, 90, 95 and the data contacts 40, 45 is arranged substantially in a common yz plane 251. As a result, for example the first and the third contact element 25, 75 can be designed to be longer overall in the longitudinal direction than the second, fourth and/or fifth contact element 55, 90, 95 and/or the data contact 40, 45. This has the advantage that the first and third contact element 25, 75 can have an extended contact portion 215 in order to transmit a particularly high electric current between the first and third contact element 25, 75, respectively, and the associated mating contact 80. The carrier 115 can compensate for different geometric designs of contact elements 25, 55, 75, 90, 95, with the result that existing machine tools for producing the first and second contact element 25, 55 do not need to be retrofitted. As a result, the set-up costs for producing the high-current contact device 10 are particularly low.

Figure 5:
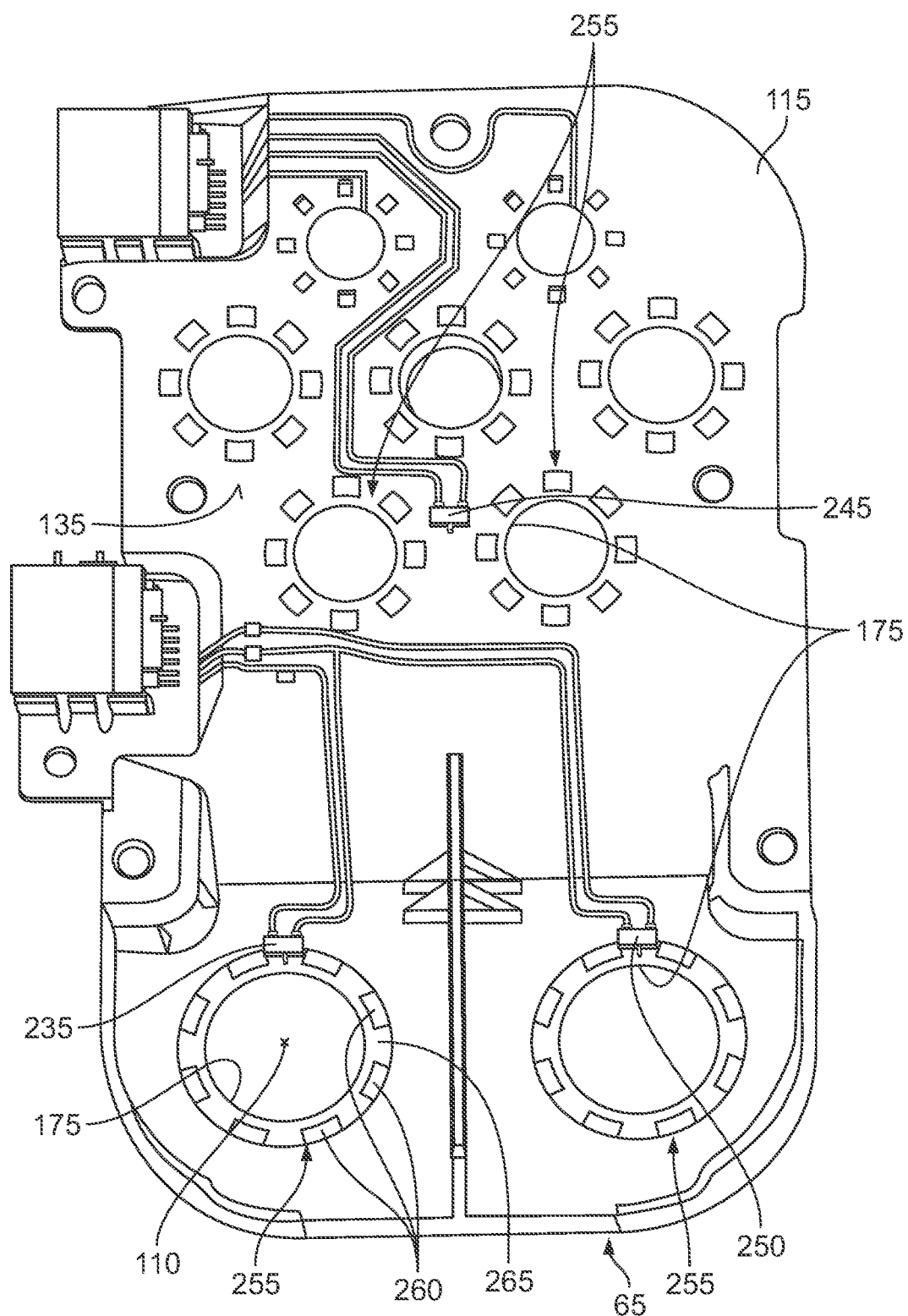
FIG. 5 is a perspective view of a carrier of a circuit carrier of the high-current contact device of FIG. 1.

FIG. 5 shows a perspective illustration of the carrier 115 of the circuit carrier 30 shown in FIG. 3. In FIG. 5, the illustration of the contact arrangements 20, 50 and the data contact arrangement 35 and the sealing sleeves 230 is omitted for reasons of clarity. The carrier 115 has, by way of example, a holding structure 255 adjoining the feedthrough 175. The holding structure 255 can be arranged on each or only some of the feedthroughs 175. The holding structure 255 is arranged on the feedthrough 175 circumferentially around the mating axis 110. The holding structure 255 can have a plurality of recesses 260 arranged in the circumferential direction in relation to the mating axis 110. The second temperature sensor 245 can be arranged on the first end side 135 centrally between three feedthroughs 175 through which the second, fourth and fifth contact element 25, 90, 95 reach. The recess 260 is designed as a passage opening and is designed in the form of part of a ring. The recesses 260 are interrupted by webs 265 running in each case in the radial direction to the feedthrough 175, wherein the first or third temperature sensor 235, 250 is arranged on one of the webs 265.

Figure 6:
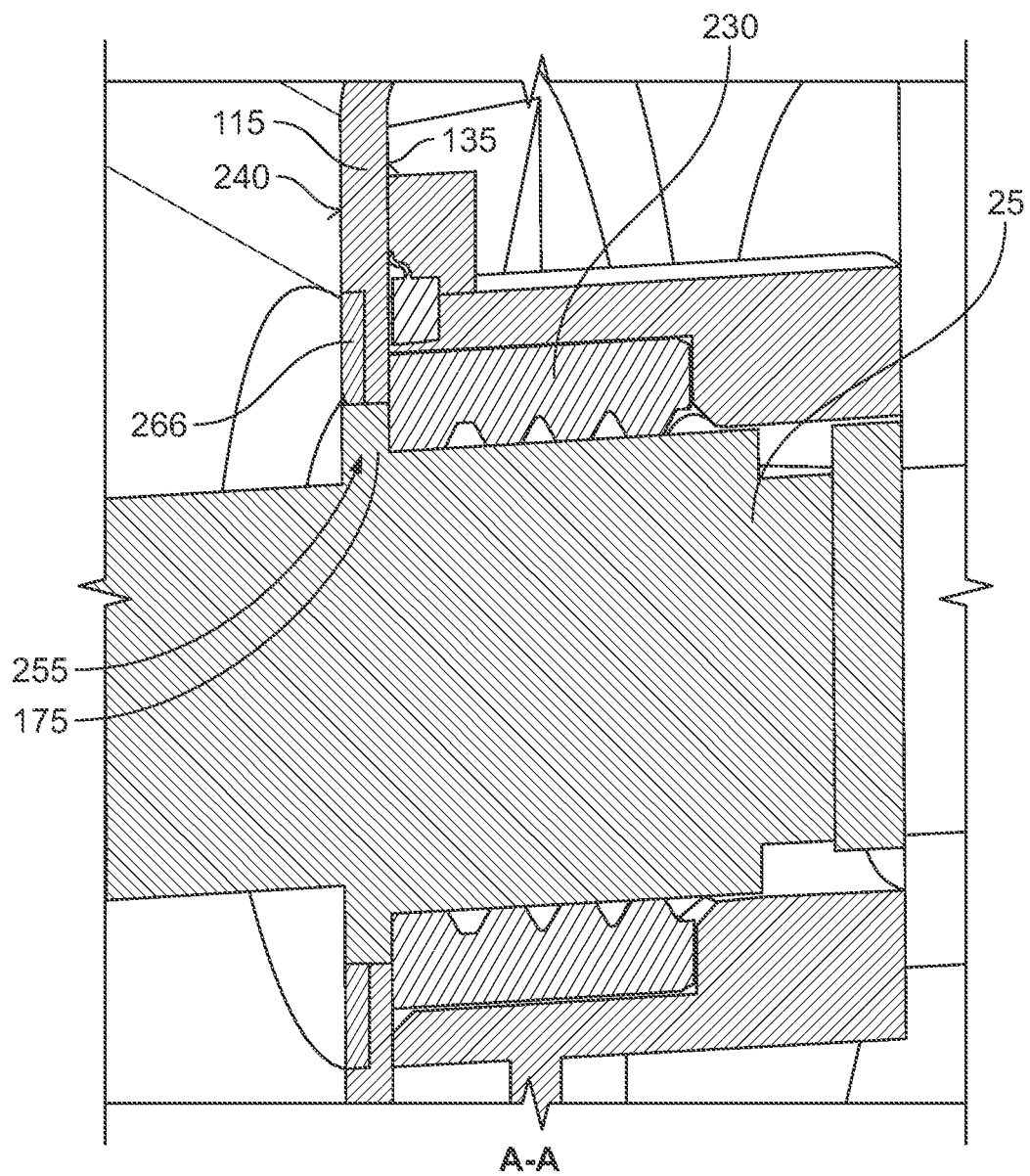
FIG. 6 is a detail view of a portion of the high-current contact device shown in FIG. 4.

FIG. 6 shows a section of the section view shown in FIG. 4. At the feedthrough 175, the holding structure 255 has a respective groove 266 formed in a circumferential manner on the second end side 240. The groove 266 connects the recesses 260 in a circumferential direction to one another on the side facing towards the second end side 240.

If the sealing sleeve 230 is injection-molded to the carrier 115 in the two-component injection-molding method, the recesses 260 and the groove 266 are filled with the matrix material (and possibly the filler material) of the sealing sleeve 230, which still has to be cured. The holding structure 255 has the advantage that the sealing sleeve 230 is connected to the carrier 115 in a materially bonded manner by way of a particularly large surface area. The sealing sleeve 230 is also connected to the carrier 115 via the groove 266 in a form-fitting manner by the undercut on the web 265. The sealing sleeve 230 closes the recess 260 and the web 265 is embedded at least in certain regions in the sealing sleeve 230. As a result, when the respectively associated contact element 25, 55, 75, 90, 95 or the data contact 40, 45 is plugged into the associated feedthrough 175, the sealing sleeve 230 is prevented from undesirably being torn from the carrier 115. The materially bonded connection of the sealing sleeve 230 prevents a creep gap at the sealing sleeve 230 with respect to the carrier 115.

FIGS. 7 to 12 show a section of the high-current contact device 10 shown in FIGS. 1 to 6 in each case after a production step.

Figure 7:
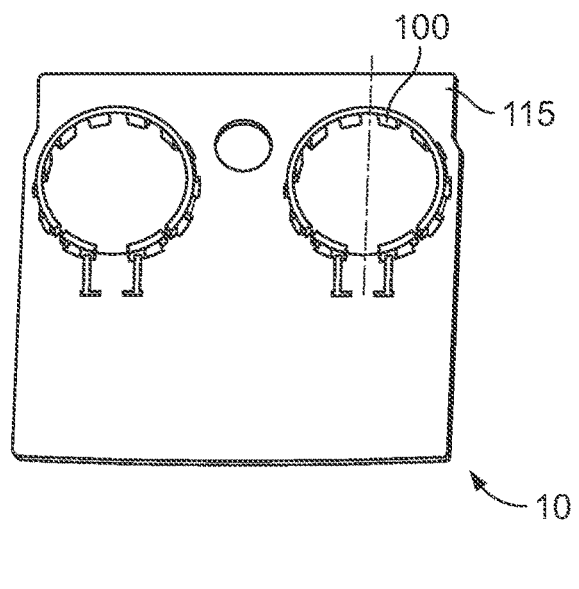
FIG. 7 is a perspective view of a first step of producing the high-current contact device.

In a first production step, shown in FIG. 7, the carrier 115 is produced using injection molding. Here, in contrast to the design shown in FIGS. 1 to 6, the holding structure 255 can also be pushed out at the feedthrough 175 axially along the mating axis 110.

Figure 8:
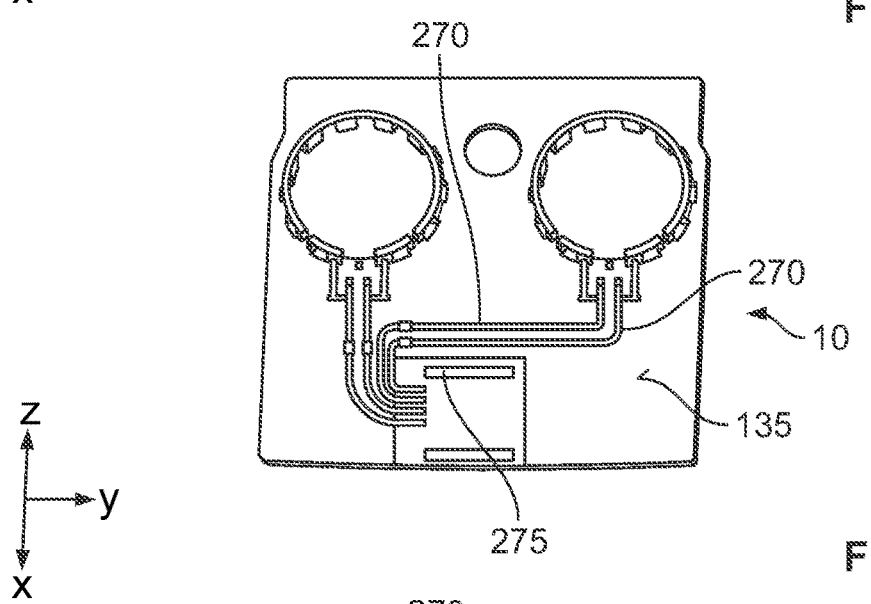
FIG. 8 is a perspective view of a second step of producing the high-current contact device.

In a second production step, shown in FIG. 8, which follows the first production step in an embodiment, the first end side 135 is surface-treated at least in certain regions, for example by a laser. The treatment is effected in such a way that tracks 270 are formed on the first end side 135. The tracks 270 determine a later profile of the conductor tracks 145, 150, 155, 160, 252 and a securing region 275 for securing the temperature sensor 235, 245, 250.

Figure 9:
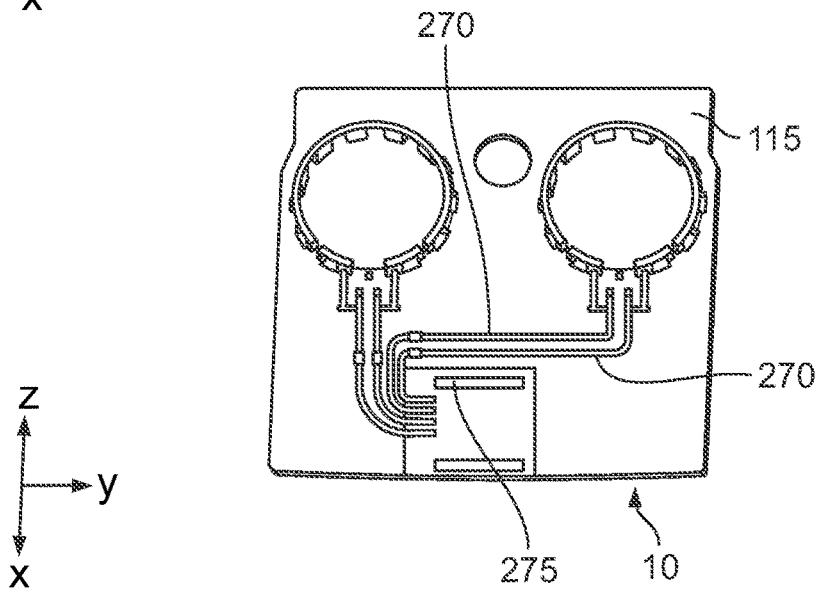
FIG. 9 is a perspective view of a third step of producing the high-current contact device.

In a third production step, shown in FIG. 9, following the second production step, the carrier 115 is galvanized, wherein a metal that is to be deposited for forming the conductor track 145, 150, 155, 160, 252 is deposited on the tracks 270 and securing regions 275 produced in the second production step.

Figure 10:
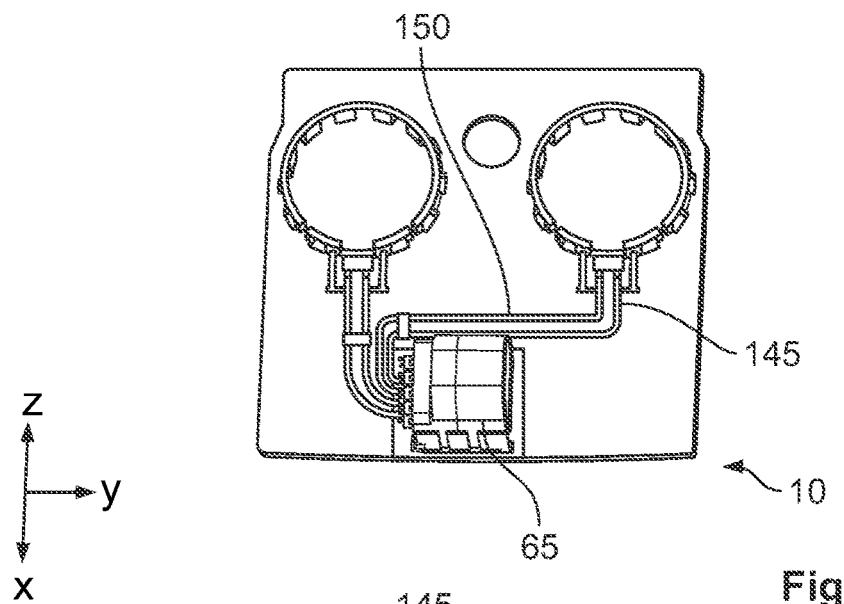
FIG. 10 is a perspective view of a fourth step of producing the high-current contact device.

In a fourth production step, shown in FIG. 10, carried out after the third production step, the components of the electrical circuit 165 are positioned and soldered to the associated conductor track 145, 150, 155, 160, 252, for example by a reflow soldering method. The data contact device 65, 70 is also likewise positioned and soldered to the securing region 275.

Figure 11:
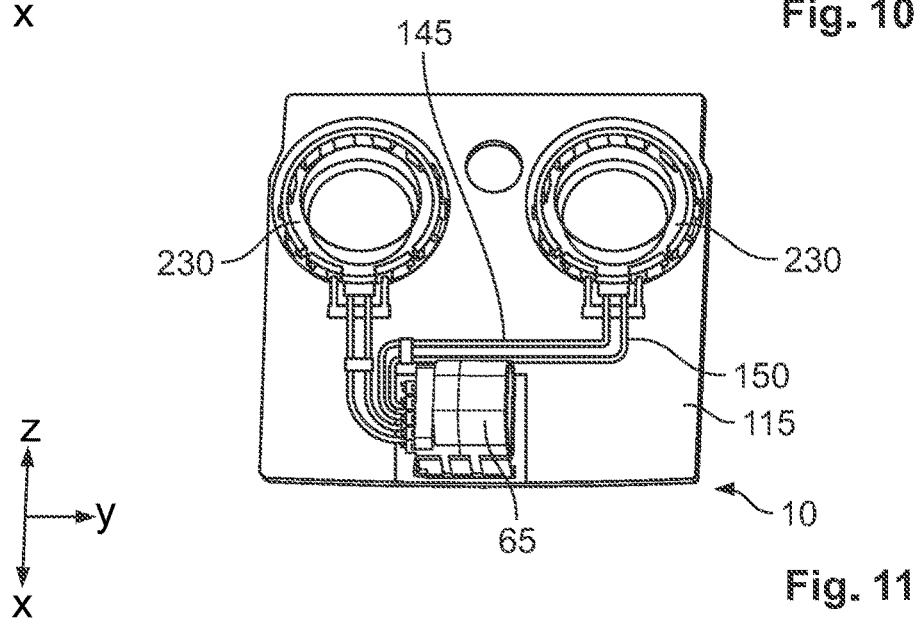
FIG. 11 is a perspective view of a fifth step of producing the high-current contact device.

In a fifth production step, shown in FIG. 11, following the fourth production step, the sealing sleeve 230 is injection-molded to the carrier 115 by the two-component injection-molding method and cured. Here, the shape is designed in such a way that the individual sealing sleeves 230 are arranged next to one another at a distance in the y direction without contact. This has the advantage that material consumption for producing the sealing sleeve 230 is low and also a form for making the sealing sleeves 230 can engage well between the individual sealing sleeves 230.

Figure 12:
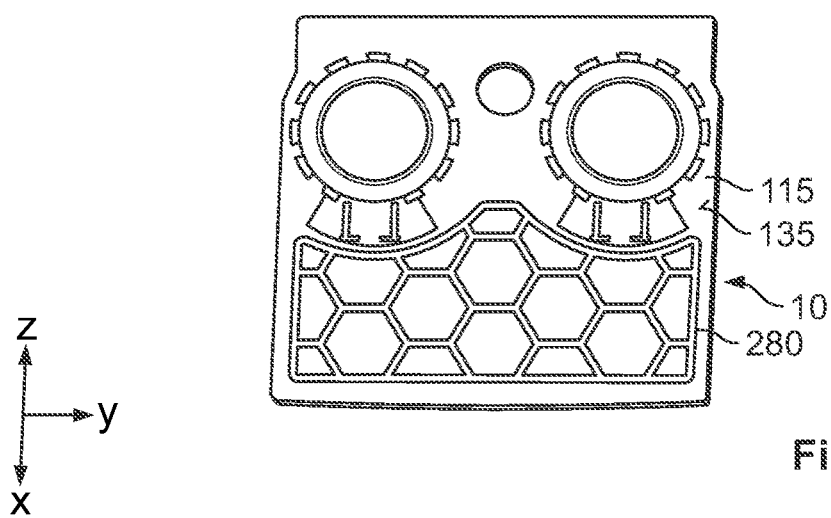
FIG. 12 is a perspective view of a second end side of a carrier of the high-current contact device formed by the production method.

In addition, a reinforcing structure 280 can be shaped into the design shown in FIGS. 1 to 6 when the carrier 115 is injection-molded onto the second end side 240, as shown in FIG. 12. The reinforcing structure 280 serves to reduce bending upon assembly of the data contact device 65, 70, with the result that deformation of the conductor tracks 145, 150, 155, 160, 252 is thereby reduced. As a result, damage to the conductor tracks 145, 150, 155, 160, 252 can be prevented.

The design shown in FIGS. 1 to 12 has the advantage that the number of components for the high-current contact device 10 is significantly reduced. A reliable and simple sealing of the housing interior 100 of the contact housing 15 is ensured by the sealing sleeve 230 at each of the data contacts 40, 45 and/or the contact elements 25, 55, 75, 90, 95. In particular for the data contacts 40, 45, a complex manual assembly being necessary for feeding cables through seals is also prevented.

The high-current contact device 10 shown in FIGS. 1 to 12 is also suitable, in particular, for being produced and wired in a fully automated manner. The assembly outlay is also low owing to the introduction of the circuit carrier 30 into the housing interior 100, with the result that the assembly time is particularly short. The number of components of the high-current contact device 10 is also particularly low. Overall, an assembly time saving of more than 50 percent is achieved compared to known high-current contact devices.

What is claimed is:

1. A high-current contact device, comprising:
   a first contact element transmitting electrical energy;
   a circuit carrier, the first contact element extends through the circuit carrier along a mating axis at a feedthrough;
   a first data contact transmitting data; and
   a data interface, a conductor track of the circuit carrier electrically connects the first data contact to the data interface, a carrier of the circuit carrier is injection-molded and mechanically supports the first data contact, the conductor track, and the data interface.

2. The high-current contact device of claim 1, further comprising a contact housing delimiting a housing interior, the first data contact, the circuit carrier, and the first contact element are arranged in the housing interior.

3. The high-current contact device of claim 2, wherein the data interface extends through the contact housing laterally in a plane inclined to the mating axis.

4. The high-current contact device of claim 1, wherein the carrier is monolithically formed in a single piece from a same material.

5. The high-current contact device of claim 1, wherein the carrier has a first portion and a second portion connected to the first portion, the second portion is arranged offset to the first portion in relation to the mating axis.

6. The high-current contact device of claim 5, wherein the feedthrough is arranged in the first portion and the first data contact is arranged on the second portion.

7. The high-current contact device of claim 6, further comprising a second contact element transmitting electrical energy, the second contact element is of a different design than the first contact element and is arranged on the second portion.

8. The high-current contact device of claim 1, wherein the carrier has a reinforcing rib extending along the mating axis.

9. The high-current contact device of claim 1, further comprising a sealing sleeve secured to the circuit carrier and adjoining the feedthrough axially in relation to the mating axis, the sealing sleeve engages around the first contact element in a fluid-tight manner.

10. The high-current contact device of claim 9, wherein the sealing sleeve is connected to the circuit carrier in a materially bonded manner.

11. The high-current contact device of claim 10, wherein the sealing sleeve is connected to the circuit carrier in a form-fitting manner.

12. The high-current contact device of claim 9, wherein the carrier has a holding structure at the feedthrough with a recess and a web that delimits the recess.

13. The high-current contact device of claim 12, wherein the sealing sleeve closes the recess and the web is embedded at least in regions in the sealing sleeve.

14. The high-current contact device of claim 1, further comprising an electrical circuit arranged on the circuit carrier, the electrical circuit is designed to identify a piece of information about an operating parameter of the high-current contact device.

15. The high-current contact device of claim 14, wherein the circuit carrier electrically connects the electrical circuit to the data interface by a further conductor track and provides the piece of information at the data interface.

16. The high-current contact device of claim 15, wherein the electrical circuit has a temperature measuring device with a temperature sensor, the temperature sensor measures a temperature of the first contact element as the operating parameter.

17. The high-current contact device of claim 16, wherein the temperature sensor is embedded in a sealing sleeve secured to the circuit carrier, the sealing sleeve engages around the first contact element in a fluid-tight manner, the sealing sleeve is thermally conductive and thermally connects the temperature sensor to the first contact element.

18. The high-current contact device of claim 17, wherein the sealing sleeve includes at least one of the following materials: copper, aluminum, aluminum oxide, aluminum nitrate, silicon oxide, silicon nitrate, boron nitride, plastic, temperature-resistant plastic, silicone, and polyurethane.

19. The high-current contact device of claim 17, wherein the sealing sleeve is injection-molded and the temperature sensor is connected to the sealing sleeve in a materially bonded manner.

20. A method for producing a high-current contact device, comprising:
   providing a first contact element transmitting electrical energy and a first data contact transmitting data;
   injection-molding a carrier of a circuit carrier, the first contact element extends through the circuit carrier along a mating axis at a feedthrough;
   forming a conductor track on the carrier; and
   securing a data interface to the circuit carrier, the conductor track electrically connects the first data contact to the data interface, the carrier mechanically supports the first data contact, the conductor track, and the data interface.

* * * * *